United States Patent
Nandakumar et al.

(10) Patent No.: US 8,125,035 B2
(45) Date of Patent: Feb. 28, 2012

(54) CMOS FABRICATION PROCESS

(75) Inventors: Mahalingam Nandakumar, Richardson, TX (US); Song Zhao, Plano, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 244 days.

(21) Appl. No.: 12/696,215

(22) Filed: Jan. 29, 2010

(65) Prior Publication Data

US 2010/0133624 A1 Jun. 3, 2010

Related U.S. Application Data

(62) Division of application No. 12/209,270, filed on Sep. 12, 2008, now Pat. No. 7,678,637.

(51) Int. Cl.
*H01L 27/092* (2006.01)
(52) U.S. Cl. .. 257/369; 257/368; 257/288; 257/E27.062
(58) Field of Classification Search .................. 257/369, 257/288, 368
See application file for complete search history.

(56) References Cited

U.S. PATENT DOCUMENTS

| 6,200,840 | B1 | 3/2001 | Chen et al. |
| 7,198,995 | B2 | 4/2007 | Chidambarrao et al. |
| 7,396,717 | B2 | 7/2008 | Wang et al. |
| 2007/0122987 | A1 | 5/2007 | Hsiao et al. |
| 2007/0148888 | A1 | 6/2007 | Krull et al. |
| 2008/0102588 | A1 | 5/2008 | Lee et al. |
| 2008/0258178 | A1 | 10/2008 | Wang et al. |

FOREIGN PATENT DOCUMENTS

KR 1020070002896 A 1/2007

*Primary Examiner* — Long Pham
(74) *Attorney, Agent, or Firm* — Jacqueline J. Garner; Wade J. Brady III; Frederick J. Telecky Jr.

(57) ABSTRACT

Ultra high temperature (UHT) anneals above 1200 C for less than 100 milliseconds for PMOS transistors reduce end of range dislocations, but are incompatible with stress memorization technique (SMT) layers used to enhance NMOS on-state current. This invention reverses the conventional order of forming the NMOS first by forming PSD using carbon co-implants and UHT annealing them before implanting the NSD and depositing the SMT layer. End of range dislocation densities in the PSD space charge region below 100 cm$^{-2}$ are achieved. Tensile stress in the PMOS from the SMT layer is significantly reduced. The PLDD may also be UHT annealed to reduce end of range dislocations close to the PMOS channel.

3 Claims, 8 Drawing Sheets

CMOS FABRICATION PROCESS

This is a divisional application of Ser. No. 12/209,270, filed Sep. 12, 2008.

FIELD OF THE INVENTION

This invention relates to the field of CMOS integrated circuits. More particularly, this invention relates to methods to improve p-channel MOS transistor performance.

BACKGROUND OF THE INVENTION

It is well known that lateral dimensions of n-channel metal oxide semiconductor (NMOS) and p-channel metal oxide semiconductor (PMOS) transistors in complementary metal oxide semiconductor (CMOS) integrated circuits (ICs) are shrinking in time with each new fabrication technology node, as articulated by Moore's Law. P-type source and drain (PSD) regions in PMOS transistors are typically formed by ion implanting dopants and other species, producing end of range defects which cause undesirable leakage current; the relative detrimental impact of end of range defects increases as transistor size shrinks. Laser annealing, flash annealing and other ultra high temperature (UHT) processes which heat surfaces of ICs over 1200 C for time periods less than 100 milliseconds, when performed before other anneal processes, have demonstrated significant reductions of end of range defects. Rapid thermal processing (RTP) methods, such as spike anneals, which heat ICs for time periods longer than 1 second, are not as effective at reducing end of range defects due to the necessarily lower temperatures used. Increasing temperatures above 1200 C in a rapid thermal anneal process to annihilate end of range defects would produce unacceptably high spreads in spatial distributions of boron dopants in the PSD regions. Boron has a higher diffusivity than commonly used n-type dopants, so typical CMOS IC fabrication process sequences form n-type source and drain (NSD) regions in NMOS transistors before PSD regions to minimize the thermal profile on the implanted dopants in the PSD regions.

NMOS transistors in advanced CMOS ICs are frequently enhanced by a process sequence known as stress memorization technique (SMT), in which a layer of tensile material is deposited on an IC after the NSD ion implantation process is performed and before a subsequent anneal process. During the anneal, the polycrystalline silicon (polysilicon) in the NMOS gate, which was partially amorphized by the NSD ion implants, recrystallizes with a grain configuration that exerts stress on the underlying NMOS channel when the tensile material layer is removed. The resultant strain in the NMOS channel increases the mobility of charge carriers, which desirably improves the on-state current. UHT processes are incompatible with SMT processes for several reasons: UHT annealing before deposition of the tensile layer causes recrystallization of the polysilicon in the NMOS gate, greatly reducing the SMT effect, while UHT annealing after deposition of the SMT layer hardens the SMT layer to the point of making removal problematic.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a method of forming a CMOS IC in which p-type source and drain (PSD) regions of PMOS transistors are formed before n-type source and drain (NSD) regions of NMOS transistors, in which the PSD regions are implanted with a pre-amorphization implant (PAI) and a carbon species co-implant and annealed with an ultra high temperature (UHT) process above 1200 C for less than 100 milliseconds, and in which tensile stress is applied to the NMOS gate by a stress memorization technique (SMT) layer which is deposited after the PSD UHT anneal. Optionally, p-type lightly doped drain (PLDD) regions may be annealed with a UHT process.

DETAILED DESCRIPTION

Figure 1A:
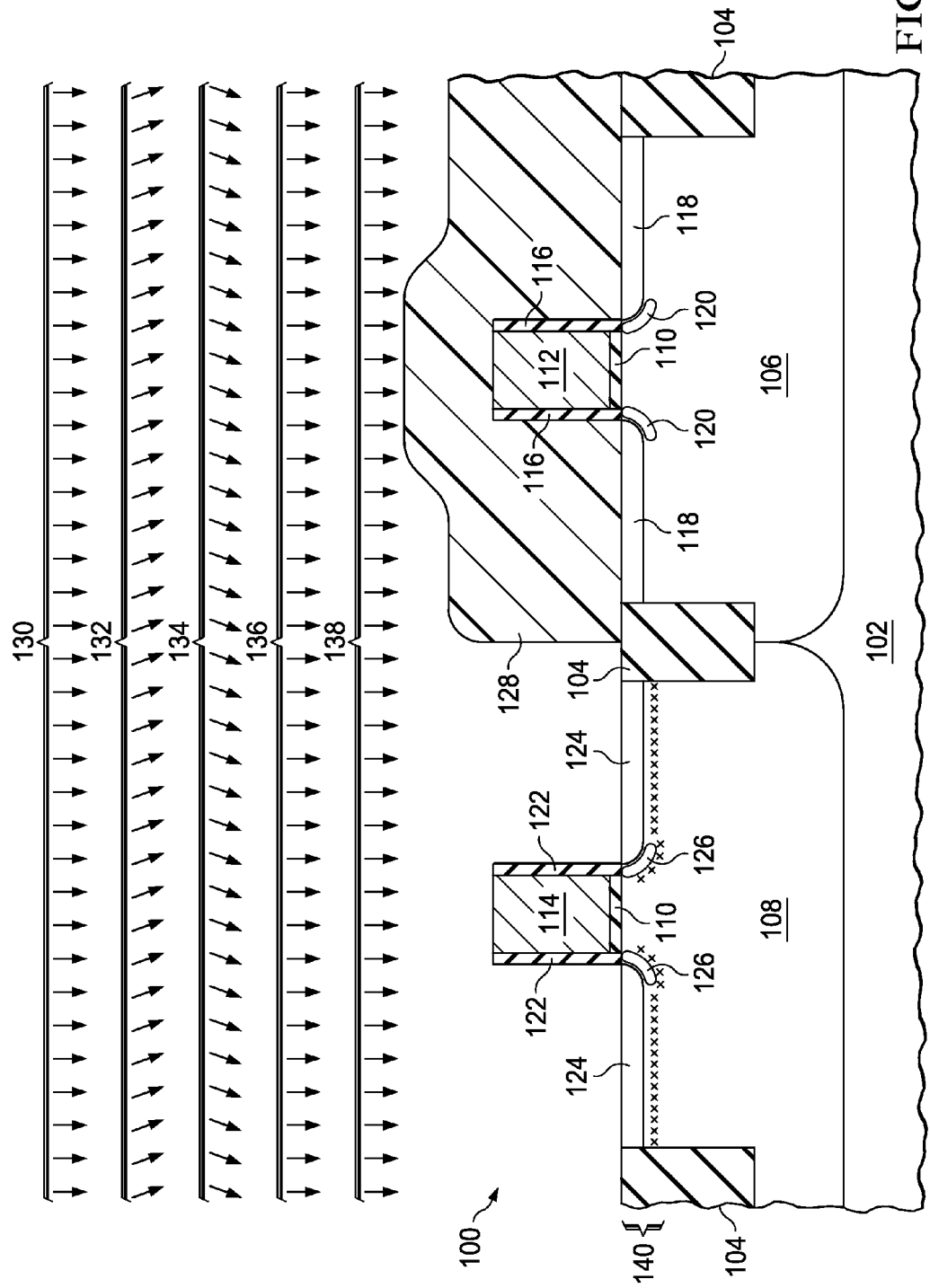
FIG. 1A through FIG. 1H are cross-sections of a CMOS IC during successive stages of fabrication of a PMOS transistor formed according to an embodiment of the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "implant" will be understood to mean "ion implant."

The need for a p-channel metal oxide semiconductor (PMOS) transistor with reduced end of range defects integrated into a complementary metal oxide semiconductor (CMOS) integrated circuit (IC) with an n-channel metal oxide semiconductor (NMOS) transistor fabricated with a stress memorization technique (SMT) process sequence is addressed by the instant invention, which provides a PMOS transistor in which p-type source and drain (PSD) regions are formed before n-type source and drain (NSD) regions are formed in the NMOS transistor, a pre-amorphization implant (PAI) process and a carbon co-implant process are used to form the PSD regions, and an ultra high temperature (UHT) anneal process, which heats the PSD regions above 1200 C for less than 100 milliseconds, is performed after the PSD implants and before an SMT layer is deposited.

FIG. 1A through FIG. 1H are cross-sections of a CMOS IC during successive stages of fabrication of a PMOS transistor formed according to an embodiment of the instant invention. Referring to FIG. 1A, the CMOS IC (100) is fabricated on a substrate (102), typically a single crystal silicon wafer with a p-type top layer having an electrical resistivity of 1 to 100 ohm-cm, but possibly a silicon-on-insulator (SOI) wafer, a hybrid orientation technology (HOT) wafer with regions of different crystal orientation, or any other substrate suitable for fabricating a CMOS IC. Elements of field oxide (104) are formed by a shallow trench isolation (STI) process sequence, in which trenches, commonly 200 to 500 nanometers deep, are etched into the CMOS IC (100), electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP). A p-type well (106), commonly called a p-well, is formed in the substrate (102), typically by ion implanting a first set of p-type dopants, including boron, possibly in the form of $BF_2$, and possibly gallium and/or indium, at doses from $1 \cdot 10^{11}$ to $1 \cdot 10^{14}$ atoms/cm$^2$, into a region defined for an NMOS transistor. A p-well photoresist pattern, not shown in FIG. 1A for clarity, is commonly used to block the first set of p-type dopants from regions defined for PMOS transistors. The p-well (106) extends from a top surface of the substrate (102) to a depth typically 50 to 500 nanometers below a bottom surface of the field oxide elements (104). The ion implantation process to form the p-well (106) may include additional steps to implant additional p-type dopants at shallower depths for purposes of improving NMOS transistor performance, such as threshold adjustment, leakage current reduction and suppression of parasitic bipolar operation. Similarly, an n-type well (108), commonly called an n-well, is formed in the substrate (102), typically by ion implanting a first set of n-type dopants, including phosphorus and arsenic, and possibly antimony, at doses from $1 \cdot 10^{11}$ to $1 \cdot 10^{14}$ atoms/cm$^2$, into a region defined for the inventive PMOS transistor. An n-well photoresist pattern, not shown in FIG. 1A for clarity, is commonly used to block the first set of n-type dopants from regions defined for NMOS transistors. The n-well (108) extends from the top surface of the substrate (102) to a depth typically 50 to 500 nanometers below the bottom surface of the field oxide elements (104). The ion implantation process to form the n-well (108) may include additional steps to implant additional n-type dopants at shallower depths for purposes of improving PMOS transistor performance, such as threshold adjustment, leakage current reduction and suppression of parasitic bipolar operation. A sheet resistivity of the n-well (108) is commonly between 100 and 1000 ohms/square.

Still referring to FIG. 1A, a gate dielectric layer (110) typically silicon dioxide, nitrogen doped silicon dioxide, silicon oxy-nitride, hafnium oxide, layers of silicon dioxide and silicon nitride, or other insulating material, commonly 1 to 3 nanometers thick, is formed on the top surface of the substrate (102). It is common to use the gate dielectric layer (110) in regions defined for NMOS transistors and in regions defined for PMOS transistors. An NMOS gate (112) and a PMOS gate (114), typically polycrystalline silicon, commonly called polysilicon, and typically 50 to 150 nanometers thick, are formed on a top surface of the gate dielectric layer (110), by deposition of a polysilicon layer on the top surface of the gate dielectric layer (110), formation of a gate photoresist pattern by known photolithographic methods on a top surface of the polysilicon layer to define the NMOS and PMOS gate regions, and removal of unwanted polysilicon by known etching methods. Typical minimum widths of NMOS gates and PMOS gates, commonly called minimum gate lengths, in advanced CMOS ICs are less than 40 nanometers.

Continuing to refer to FIG. 1A, NMOS offset spacers (116), commonly silicon dioxide or silicon nitride, or both, typically 1 to 10 nanometers thick, are formed on lateral surfaces of the NMOS gate (112), typically by oxidizing exposed surfaces of the NMOS gate (112) and/or depositing a layer of silicon dioxide or silicon nitride on the CMOS IC (100) followed by anisotropic etchback using known etching methods. N-type lightly doped drain (NLDD) regions (118) are formed by ion implanting a second set of n-type dopants, typically phosphorus and arsenic, and possibly antimony, at doses from $1 \cdot 10^{14}$ to $5 \cdot 10^{15}$ atoms/cm$^2$, at energies from 2 to 20 keV, into the substrate (102) adjacent to the NMOS offset spacers (116). P-type NMOS pocket or halo regions (120) are formed by ion implanting a second set of p-type dopants, typically boron, possibly in the form of $BF_2$, and possibly gallium and/or indium, at doses from $1 \cdot 10^{12}$ to $1 \cdot 10^{14}$ atoms/cm$^2$, at energies from 10 to 40 keV, commonly divided into subdoses and angled at 15 to 30 degrees about a vertical axis to provide uniform doping on all sides of an NMOS gate, into the substrate (102) between the NLDD regions (118) and a channel region immediately below the gate dielectric layer (110) under the NMOS gate (112). An NLDD photoresist pattern, not shown in FIG. 1A for clarity, is typically used to block the second set of n-type dopants and second set of p-type dopants from regions defined for PMOS transistors.

Figure 1B:
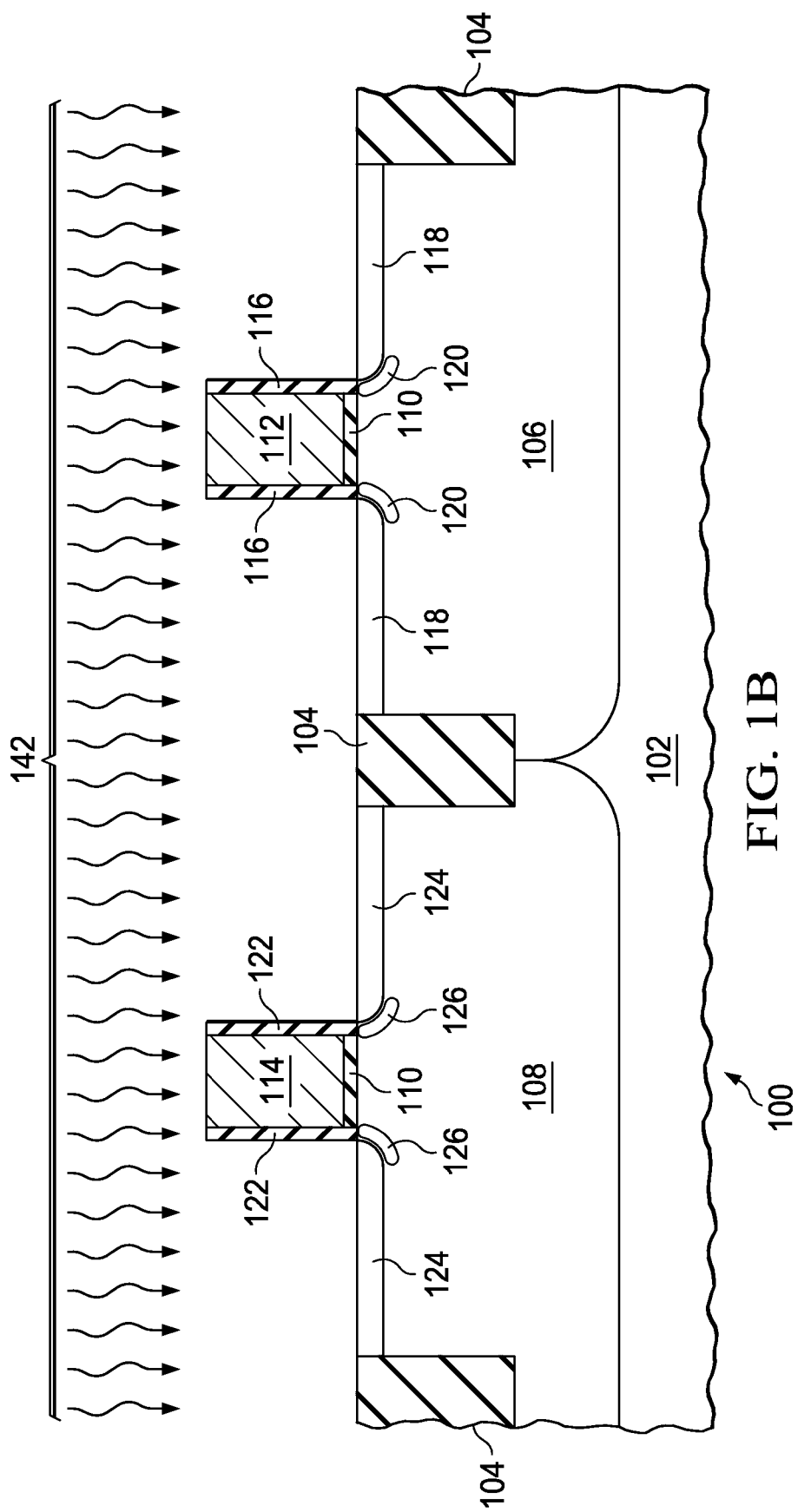

Still referring to FIG. 1A, PMOS offset spacers (122), commonly silicon dioxide or silicon nitride, or both, typically 1 to 10 nanometers thick, are formed on lateral surfaces of the PMOS gate (114), typically by oxidizing exposed surfaces of the NMOS gate (114) and/or depositing a layer of silicon dioxide or silicon nitride on the CMOS IC (100) followed by anisotropic etchback using known etching methods. Formation of p-type lightly doped drain (PLDD) regions (124) and n-type PMOS pocket or halo regions (126) proceeds by forming a PLDD photoresist pattern (128) to define regions for PLDD ion implants, which include regions defined for PMOS transistors, by known photolithographic methods. A series of PLDD ion implants is performed, including a PLDD PAI, preferably of indium, depicted schematically in FIG. 1A by reference numeral (130), at a dose between $1 \cdot 10^{13}$ to $5 \cdot 10^{14}$ atoms/cm$^2$, a first subdose of a PLDD pocket implant, typically of phosphorus and arsenic, depicted schematically in FIG. 1A by reference numeral (132), at a dose between $3 \cdot 10^{12}$ to $1 \cdot 10^{14}$ atoms/cm$^2$, and angled between 10 and 30 degrees, a second subdose of the PLDD pocket implant, depicted schematically in FIG. 1A by reference numeral (134), a PLDD dopant implant, typically of boron, preferably in the form of $BF_2$, depicted schematically in FIG. 1A by reference numeral (136), at a dose between $1 \cdot 10^{14}$ to $3 \cdot 10^{15}$ atoms/cm$^2$, and a PLDD carbon co-implant of a carbon containing species, depicted schematically in FIG. 1A by reference numeral (138), at a dose between $1 \cdot 10^{14}$ to $1 \cdot 10^{15}$ atoms/cm$^2$. In a preferred embodiment, amorphization in the PLDD regions (124) is achieved by the combined action of the PLDD PAI and the PLDD pocket implants. In alternate embodiments, a species implanted in the PLDD PAI may be chosen from a long list of materials, including group IV elements such as germanium or silicon, heavy dopant atoms such as antimony or indium, or inert gases such as argon. PLDD end of range defects (140) are formed in the substrate (102) in space charge regions of the PLDD regions (124) by the series of PLDD ion implants FIG. 1B depicts the CMOS IC (100) during a PLDD UHT anneal process, in which radiant energy, depicted schematically in FIG. 1B by reference numeral (142), from a laser, a flash light source, a microwave source, or other power source, irradiates the CMOS IC (100), raising a temperature of the PLDD regions (124) and PMOS pocket regions (126) above 1200 C for less than 100 milliseconds. A practical lower limit for the time duration of a PLDD UHT anneal process may be placed at 50 microseconds. The PLDD end of range defects are reduced below 100 dislocations/cm$^2$ during the PLDD UHT anneal by a process involving substitutional carbon from the carbon co-implant. The combination of PLDD carbon co-implant and PLDD UHT anneal is advantageous because the annihilation of PLDD end of range defects using both the carbon co-implant and UHT anneal is more complete than the use of either carbon co-implant or UHT anneal alone. In particular, substitution of a rapid thermal process (RTP) anneal, which produces a lower peak temperature and longer heating time duration, for the PLDD UHT anneal process results in an undesirable higher density of PLDD end of range defects.

It is within the scope of the instant invention to form the PLDD regions (124) and PMOS pocket regions (126) before forming the NLDD regions (118) and NMOS pocket regions (120).

Figure 1C:
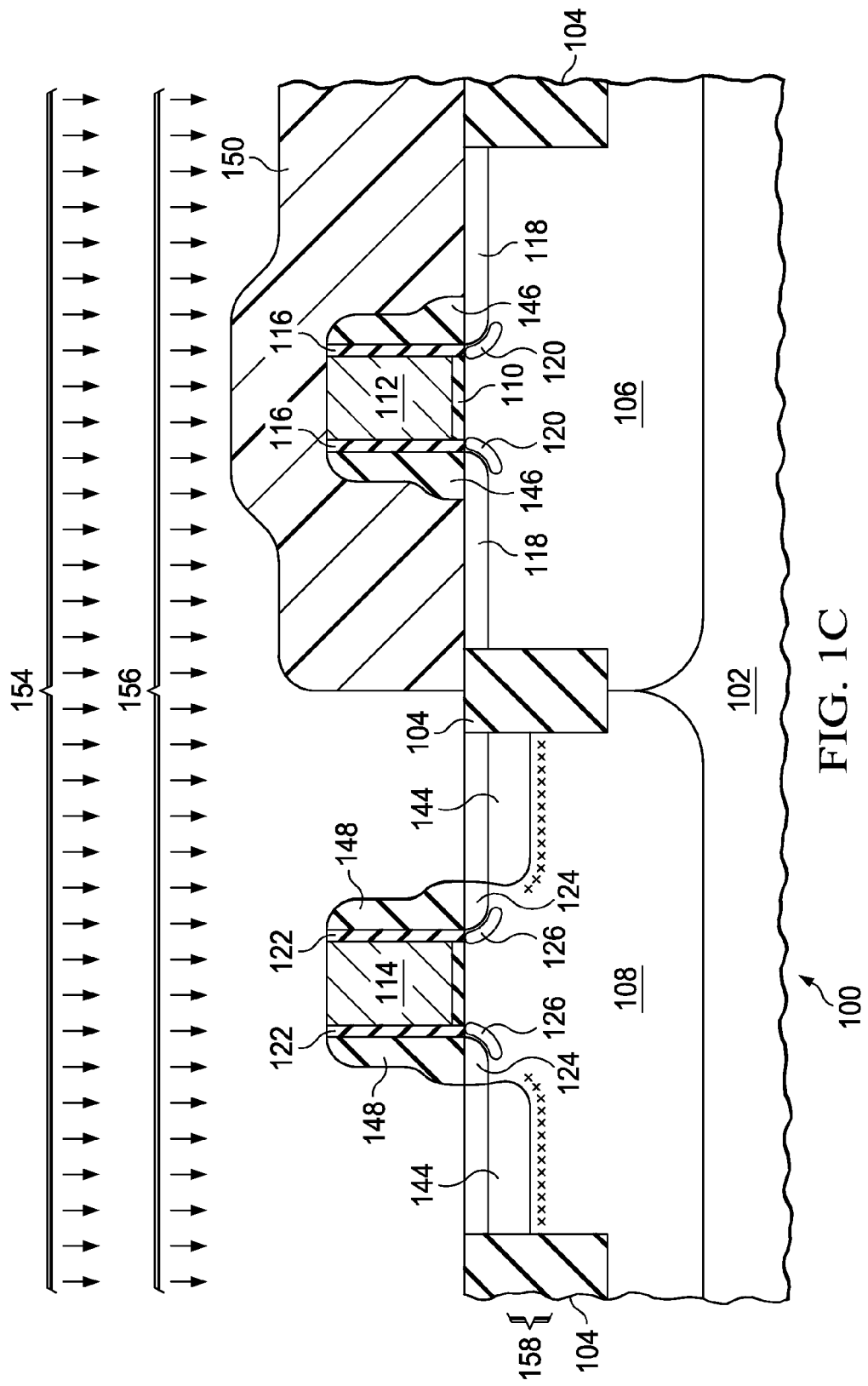
Figure 1D:
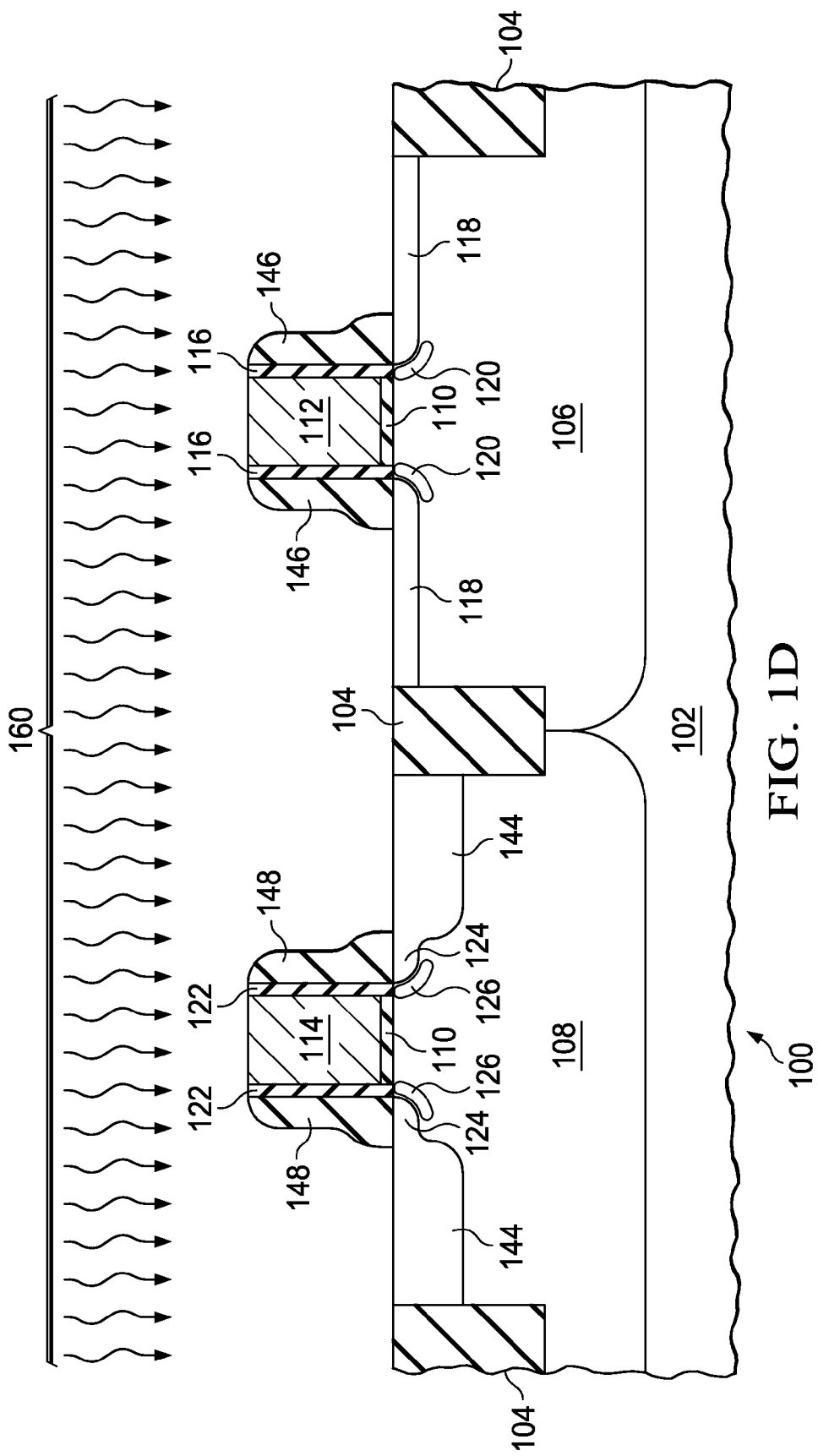

FIG. 1C depicts the CMOS IC (100) during formation of the PSD regions (144). NMOS gate sidewall spacers (146) are formed on lateral surfaces of the NMOS offset spacers (116), typically by depositing a layer or layers of silicon dioxide, silicon nitride, or both, on the NMOS gate (112), followed by anisotropically etching the deposited layers from a top surface of the NMOS gate (112) and the top surface of the substrate (102). Similarly, PMOS gate sidewall spacers (148) are formed on lateral surfaces of the PMOS offset spacers (122), typically by depositing a layer or layers of silicon dioxide, silicon nitride, or both, on the NMOS gate (112), followed by anisotropically etching the deposited layers from a top surface of the PMOS gate (114) and the top surface of the substrate (102). A PSD photoresist pattern (150) is formed to define regions for PSD ion implants, which include regions defined for PMOS transistors, by known photolithographic methods. A series of PSD ion implants is performed, including a PSD dopant implant, typically of boron, preferably in the form of $BF_2$, depicted schematically in FIG. 1C by reference numeral (154), at a dose between $5 \cdot 10^{14}$ to $1 \cdot 10^{16}$ atoms/$cm^2$, and a PSD carbon co-implant of a carbon containing species, depicted schematically in FIG. 1C by reference numeral (156), at a dose between $1 \cdot 10^{14}$ to $1 \cdot 10^{15}$ atoms/$cm^2$. PSD end of range defects (158) are formed in the substrate (102) in space charge regions of the PSD regions (144) by the series of PSD ion implants FIG. 1D depicts the CMOS IC (100) during a PSD UHT anneal process, in which radiant energy, depicted schematically in FIG. 1D by reference numeral (160), from a laser, a flash light source, a microwave source, or other power source, irradiates the CMOS IC (100), raising a temperature of the PSD regions (144) above 1200 C for less than 100 milliseconds. A practical lower limit for the time duration of a PSD UHT anneal process may be placed at 50 microseconds. The PSD end of range defects are reduced below 100 dislocations/$cm^2$ during the PSD UHT anneal by a process involving substitutional carbon from the PSD carbon co-implant. The combination of PSD carbon co-implant and PSD UHT anneal is advantageous because the annihilation of PSD end of range defects using both the carbon co-implant and UHT anneal is more complete than the use of either carbon co-implant or UHT anneal alone. In particular, substitution of an RTP anneal, which produces a lower peak temperature and longer heating time duration, for the PSD UHT anneal process results in an undesirable higher density of PSD end of range defects.

Still referring to FIG. 1D, the PLDD regions (124) and PSD regions (144) merge during the PSD UHT anneal.

Figure 1E:
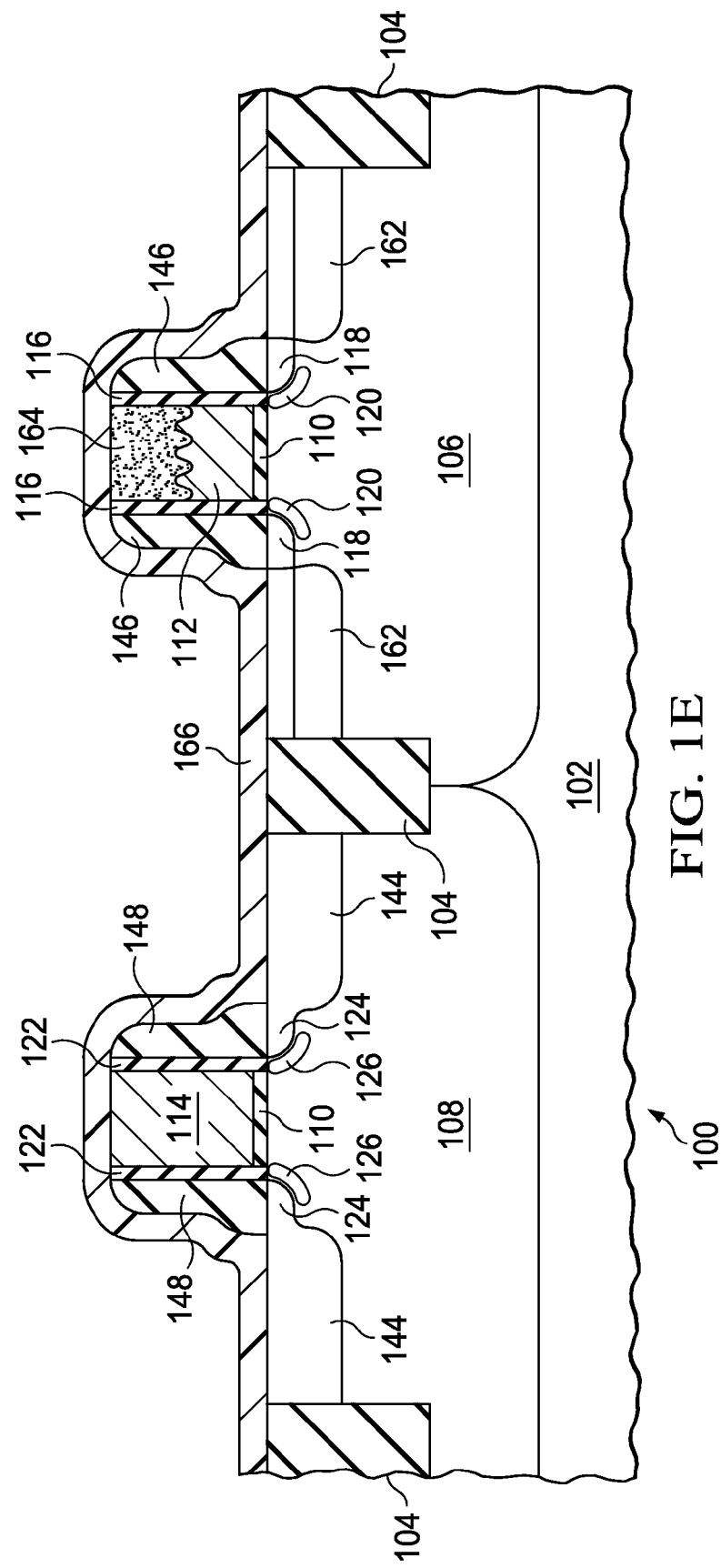

FIG. 1E depicts the CMOS IC (100) at a further stage of fabrication. NSD regions (162) are formed in the substrate adjacent to the NMOS gate sidewall spacers (146) by an NSD series of ion implants, including a third set of n-type dopants. An NSD photoresist pattern, no shown in FIG. 1E for clarity, blocks the third set of dopants from regions defined for PMOS transistors. A portion (164) of the NMOS gate (112) is amorphized by the NSD series of ion implants. A stress memorization technique (SMT) layer (166) is formed on a top surface of the CMOS IC (100) prior to annealing the NSD regions (162). The SMT layer (166) is typically silicon nitride, 10 to 200 nanometers thick, with a tensile stress between 500 and 1500 MPa.

Figure 1F:
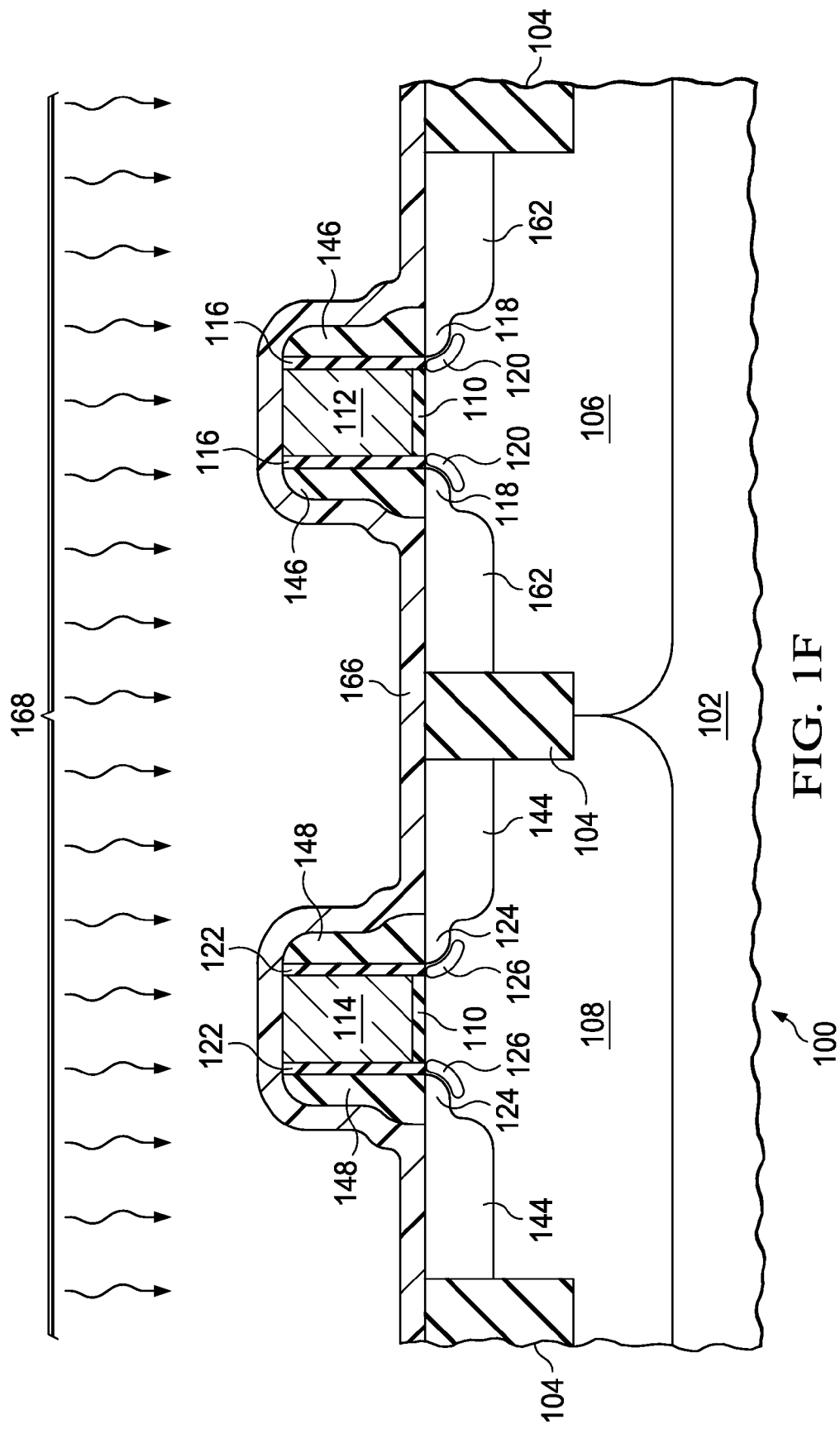

FIG. 1F depicts the CMOS IC (100) during an NSD RTP anneal of the NSD regions (162), in which the CMOS IC (100) is typically heated to 850 C to 1100 C for 1 to 60 seconds by radiant energy, depicted schematically in FIG. 1F by reference numeral (168). The NSD regions (162) and the amorphous portion of the NMOS gate (112) are recrystallized during the NSD RTP anneal in a manner that introduces tensile stress, typically between 50 and 1000 MPa, to the NMOS gate after the SMT layer (166) is removed. The tensile stress in the NMOS gate (112) desirably increase the NMOS transistor on-state current. Tensile stress in the PMOS gate (114) does not have desirable effects, so the process sequence of ion implanting the PSD regions (144) and annealing them before deposition of the SMT layer (166) is advantageous because the tensile stress of the SMT layer (166) is not effectively transferred to the annealed PMOS gate (114). The SMT layer (166) is removed by known etching methods before subsequent anneal process steps.

Figure 1G:
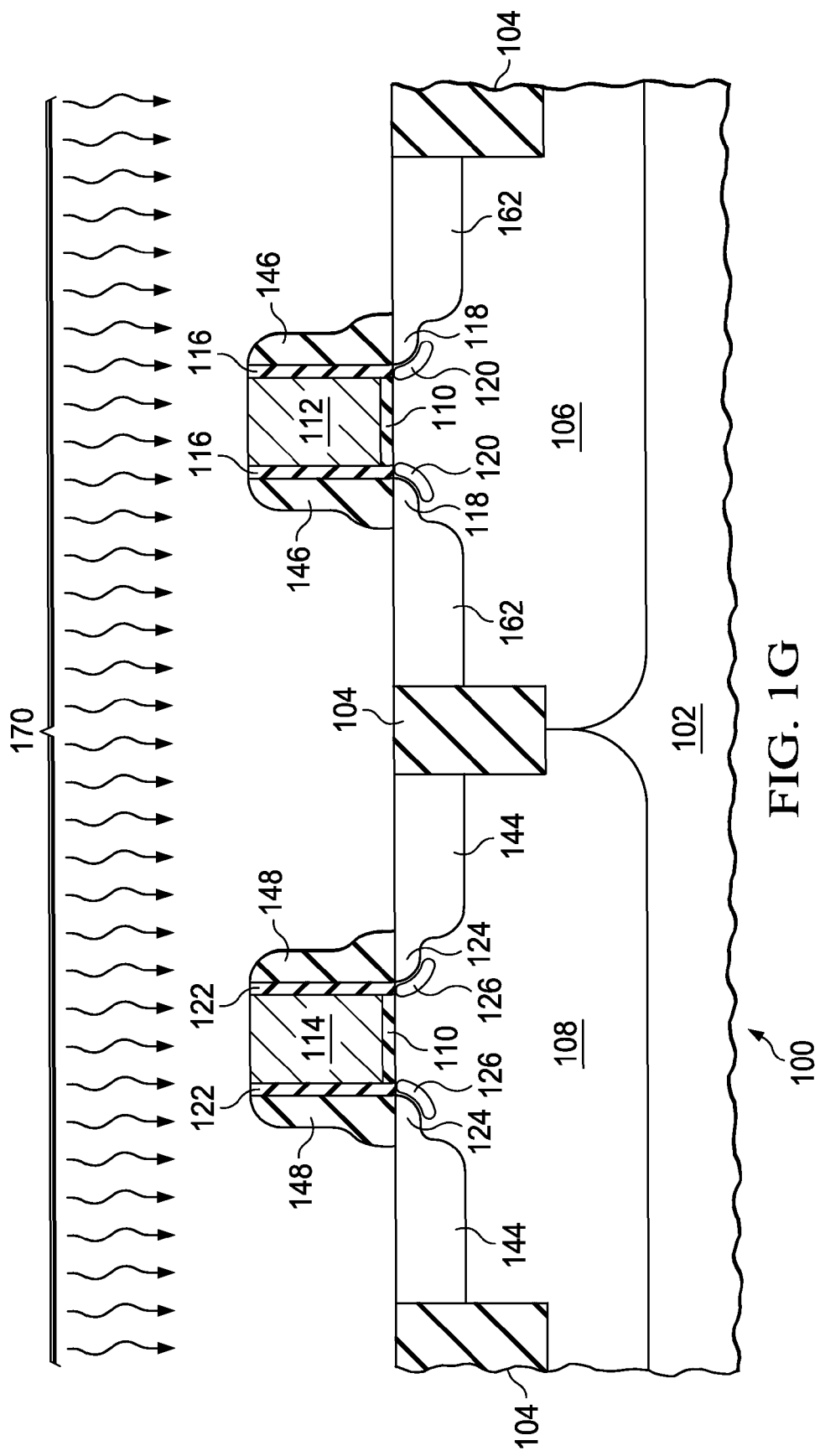

FIG. 1G depicts the CMOS IC (100) after removal of the SMT layer, during an optional subsequent post-NSD UHT anneal process step. Similarly to previous UHT anneal processes, the post-NSD UHT anneal process irradiates the CMOS IC (100) with radiant energy, depicted schematically in FIG. 1G by reference numeral (170), from a laser, a flash light source, a microwave source, or other power source, raising the temperature of the NSD and PSD regions (144, 162) above 1200 C for less than 100 milliseconds. More dopant atoms in the NSD regions (162) are activated and more damage from the NSD series of ion implants is repaired by the post-NSD UHT anneal process.

Figure 1H:
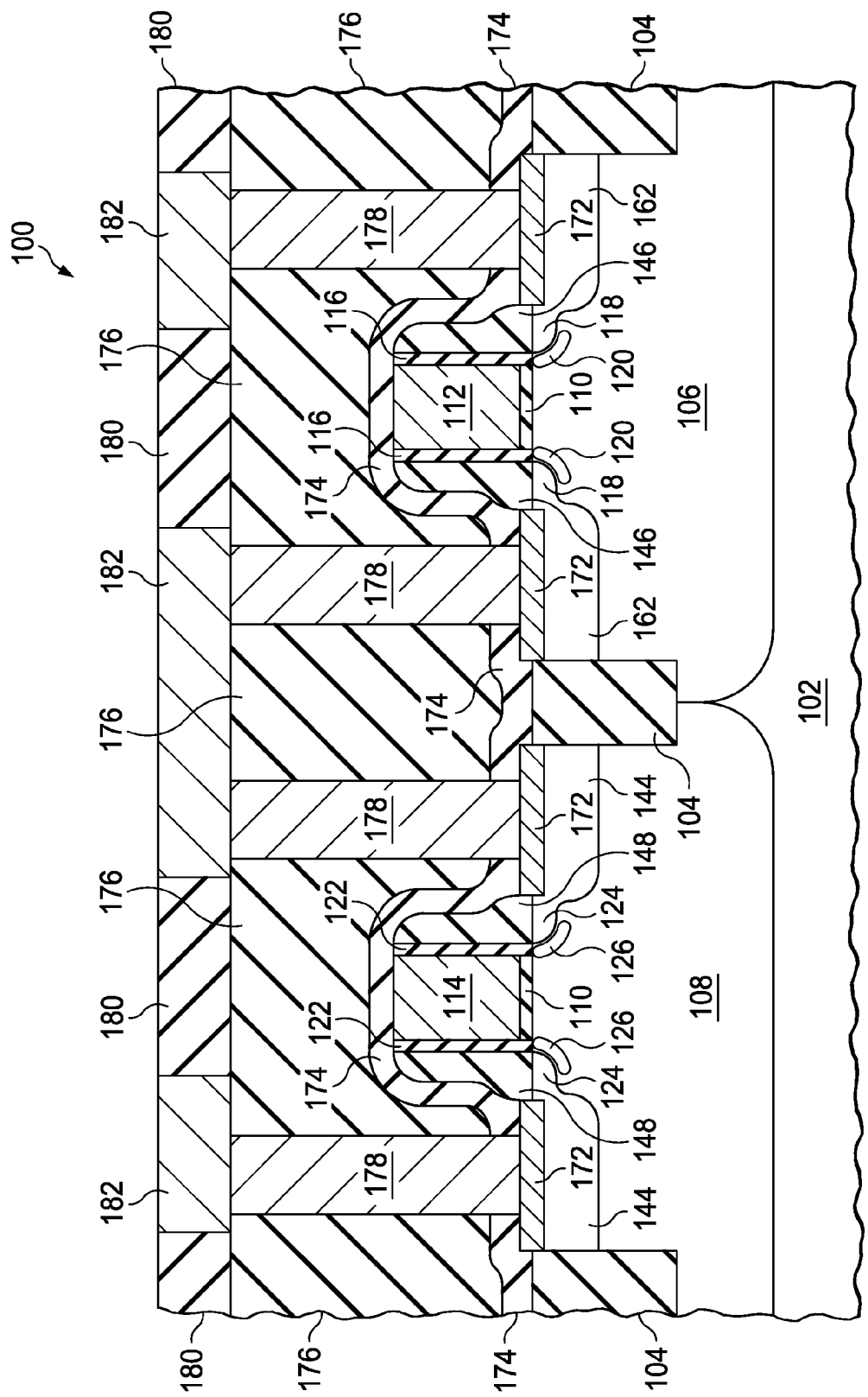

FIG. 1H depicts the CMOS IC (100) at a further stage of fabrication. Layers of metal silicide (172), typically nickel silicide, but possibly cobalt silicide, titanium silicide, or another metal silicide, are formed on top surfaces of the PSD regions (144) and NSD regions (162) to reduce electrical resistance to the PSD regions (144) and NSD regions (162), respectively. A pre-metal dielectric layer (PMD), typically a dielectric layer stack including a silicon nitride or silicon dioxide PMD liner (174), 10 to 100 nanometers thick deposited by plasma enhanced chemical vapor deposition (PECVD), a layer of silicon dioxide, phospho-silicate glass (PSG) or boro-phospho-silicate glass (BPSG) (176), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide, is formed on a top surface of the CMOS IC (100). Contacts (178) are formed in the PMD and PMD liner (174, 176) by etching contact holes in the PMD and PMD liner (174, 176) to expose the metal silicide layers (172), and filling the contact holes with contact metal, typically tungsten, such that electrical connections between the contacts (178) and the metal silicide layers (172) are formed. An intra-metal dielectric (IMD) layer (180) is formed on a top surface of the PMD (176), typically 100 or 200 nanometers thick, and typically of a material commonly known as a low-k dielectric, which has a dielectric constant less than that of silicon dioxide, such as organo-silicate glass (OSG), carbon-doped silicon oxide (SiCO or CDO) or methylsilsesquioxane (MSQ). Metal interconnects (182), typically copper, but possibly aluminum, are formed in the IMD layer (180) contacting top surfaces of the contacts (178). A PSD region (144) may be electrically connected to an NSD region (162) through metal silicide layers (172), contacts (178) and a metal interconnect (182) to form a portion of a circuit in the CMOS IC (100).

What is claimed is:

1. A CMOS IC, comprising:
   a substrate;
   an NMOS transistor further comprising an NMOS gate with 50 to 500 MPa tensile stress; and
   a PMOS transistor further comprising PSD regions with less than 100 dislocations/$cm^2$ in space charge regions of said PSD regions.

2. The CMOS IC of claim 1, in which said PMOS transistor further comprises PLDD regions with less than 100 dislocations/$cm^2$ in space charge regions of said PLDD regions.

3. The CMOS IC of claim 2, further comprising:
   metal silicide layers formed on top surfaces of said PSD regions;
   a PMD liner formed on top surfaces of said metal silicide layers;
   a PMD layer formed on a top surface of said PMD liner;
   contacts formed in said PMD and said PMD liner which make electrical connections with said metal silicide layers;
   an IMD layer formed on a top surface of said PMD; and
   a set of metal interconnects formed in said IMD layer which make electrical connections to said contacts.

* * * * *